United States Patent [19]

Fiedziuszko et al.

[11] Patent Number: 5,105,158
[45] Date of Patent: Apr. 14, 1992

[54] DIELECTRIC MICROWAVE RESONATOR PROBE

[75] Inventors: Slawomir J. Fiedziuszko; Peter D. Heidmann, both of Palo Alto, Calif.

[73] Assignee: Space Systems/Loral, Inc., Palo Alto, Calif.

[21] Appl. No.: 479,509

[22] Filed: Feb. 13, 1990

[51] Int. Cl.$^5$ .................. G01R 27/00; H01P 7/10
[52] U.S. Cl. .................. 324/693; 324/708; 333/219.1
[58] Field of Search ........... 324/629, 633, 636, 637, 324/691, 693, 708, 71.6, 653, 632; 333/219.1

[56] References Cited

U.S. PATENT DOCUMENTS

| | | | |
|---|---|---|---|
| 3,015,960 | 1/1962 | Steele | 324/71.6 X |
| 3,953,796 | 4/1976 | Keller | 324/158 |
| 4,353,027 | 10/1982 | Ballato et al. | 324/708 X |
| 4,484,162 | 11/1984 | Kamada et al. | 333/219.1 |
| 4,620,169 | 10/1986 | Blickstein | 333/219.1 X |
| 4,628,283 | 12/1986 | Reynolds | 333/219.1 X |
| 4,630,012 | 12/1986 | Fuller et al. | 333/219.1 X |
| 4,692,727 | 9/1987 | Wakino et al. | 333/219.1 |
| 4,739,249 | 10/1988 | Nyfors et al. | 324/634 |
| 4,868,488 | 9/1989 | Schmall | 324/635 |
| 4,963,841 | 10/1990 | Sparagna | 333/219.1 X |

FOREIGN PATENT DOCUMENTS

0048502 3/1983 Japan .................. 333/219.1

OTHER PUBLICATIONS

F. J. Tischer et al., "Resonant Cavities for the Measurement of the Surface Resistance of Conductors at Millimeter Wavelengths", *Rev. Sci. Instrum.*, vol. 46, No. 1, Jan. 1975.

S. J. Fiedziuszko et al., "Dielectric Resonator Used as a Probe for High TC Superconductor Measurements", 1989, IEEE MTT—S Digest.

Yoshio Kobayashi et al., "Microwave Measurement of Dielectric Properties of Low—Loss Materials by the Dielectric Rod Resonator Method", *IEEE Transactions on Microwave Theory and Techniques*, vol. MTT-33, No. 7, Jul. 1985.

Marian W. Pospieszalski, "On the Theory and Application of the Dielectric Post Resonator", *IEEE Transactions on Microwave Theory and Techniques*, pp. 228-231, Mar., 1977.

Aly Fathy, et al., "Microwave Characteristics and Characterization of High Tc Superconductors", *Microwave Journal*, pp. 75-94, Oct., 1988.

B. W. Hakki, et al., "A Dielectric Resonator Method of Measuring Inudctive Capacities in the Millimeter Range", *IRE Transaction on Microwave Theory and Techniques*, vol. MTT—8, Jul. 1960.

Primary Examiner—Kenneth A. Wieder
Attorney, Agent, or Firm—Townsend and Townsend

[57] ABSTRACT

A dielectric resonator probe for measuring surface resistance of a test material, particularly at cryogenic temperature, is provided. A dielectric resonator is mounted near to but spaced from a conductive plate and is positioned in contact with a test material. Preferably, a low-loss dielectric spacer separates the resonator from the upper plate. The dielectric resonator has a larger lower surface area than upper surface area. The dielectric resonator includes a hole therethrough for increasing mode separation and for accommodating a mounting bolt. The mounting bolt is preferably nonconductive and is coupled to a spring for resiliently mounting the resonator and spacer to the plate so as to accommodate differential thermal expansion of the components.

28 Claims, 3 Drawing Sheets

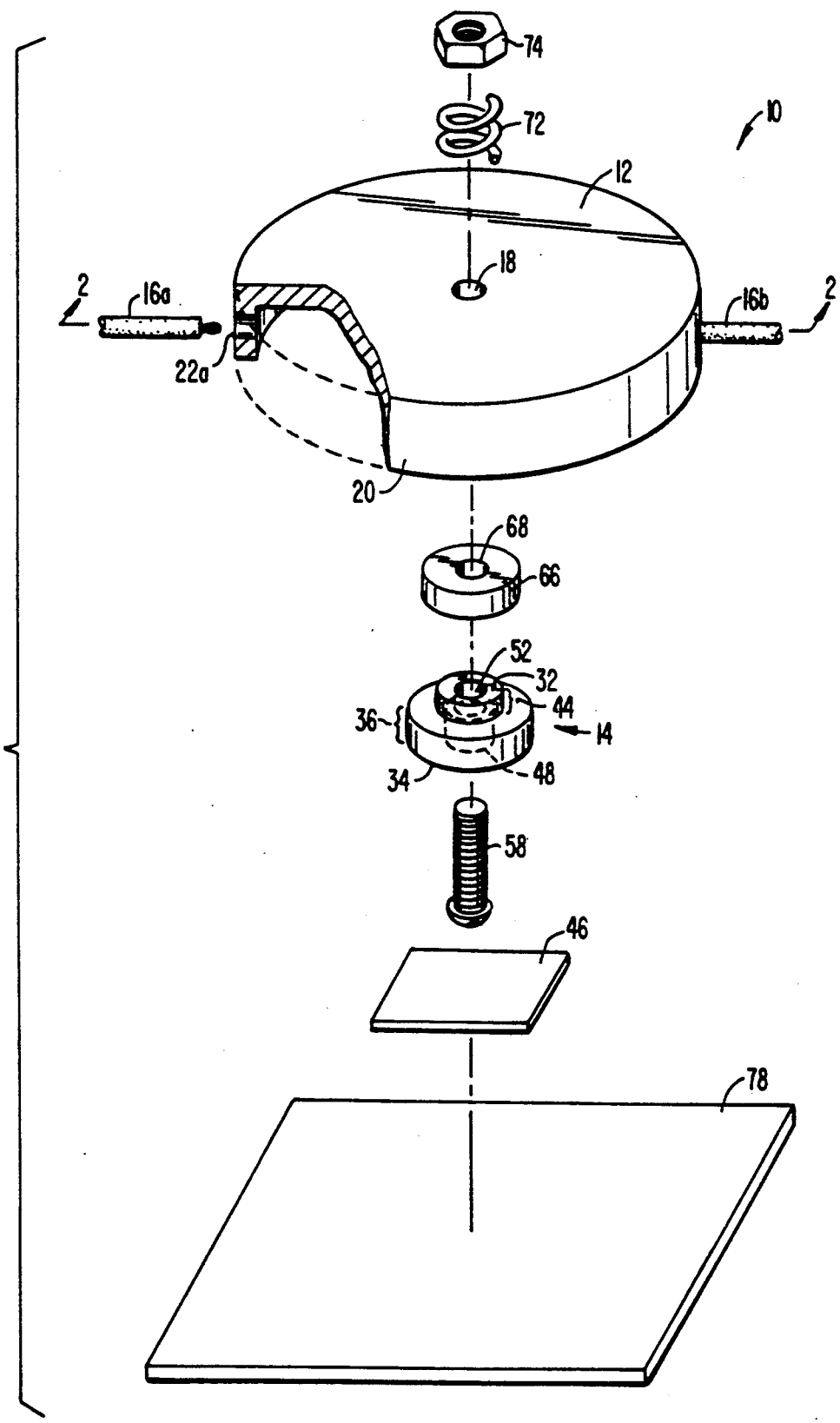
FIG._1.

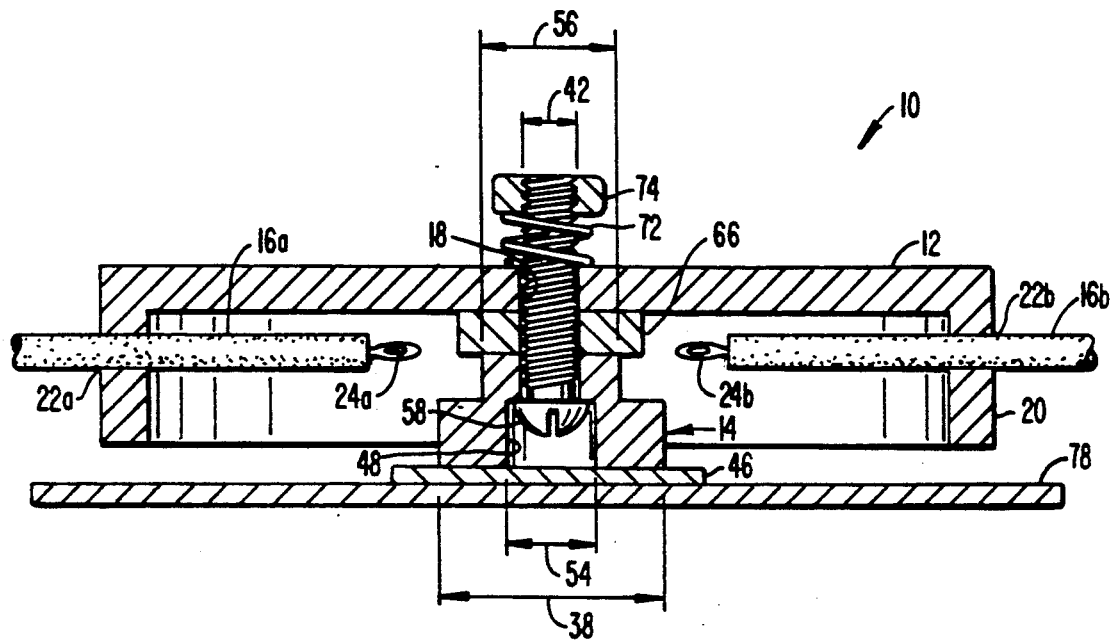
FIG._2.
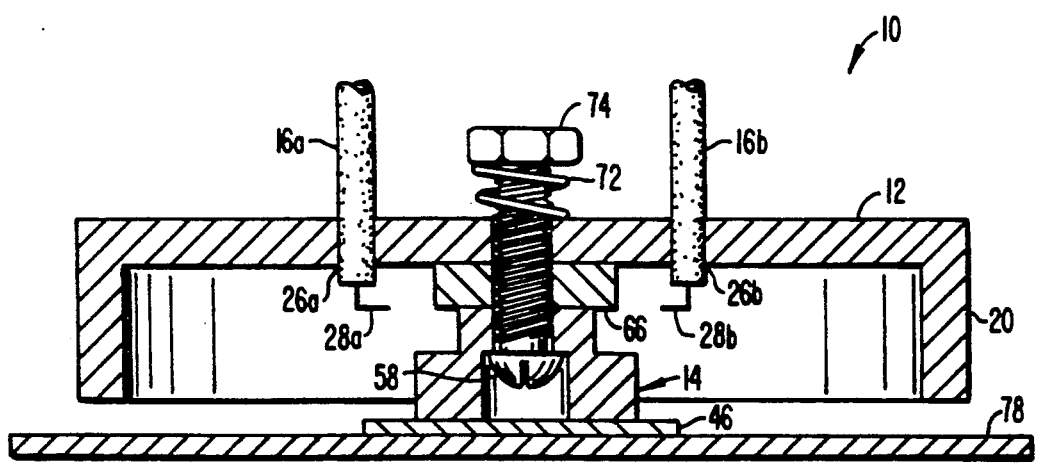
FIG._3.

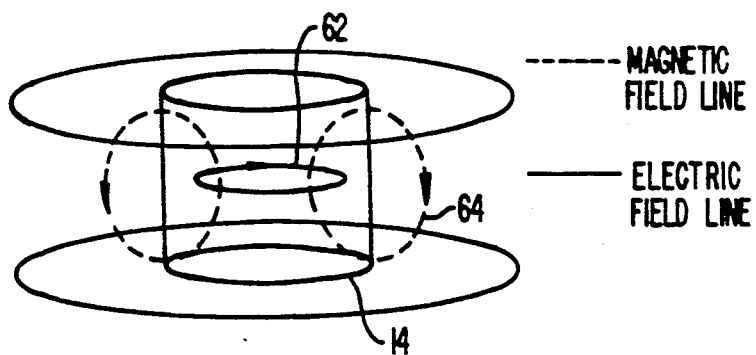
FIG._4.
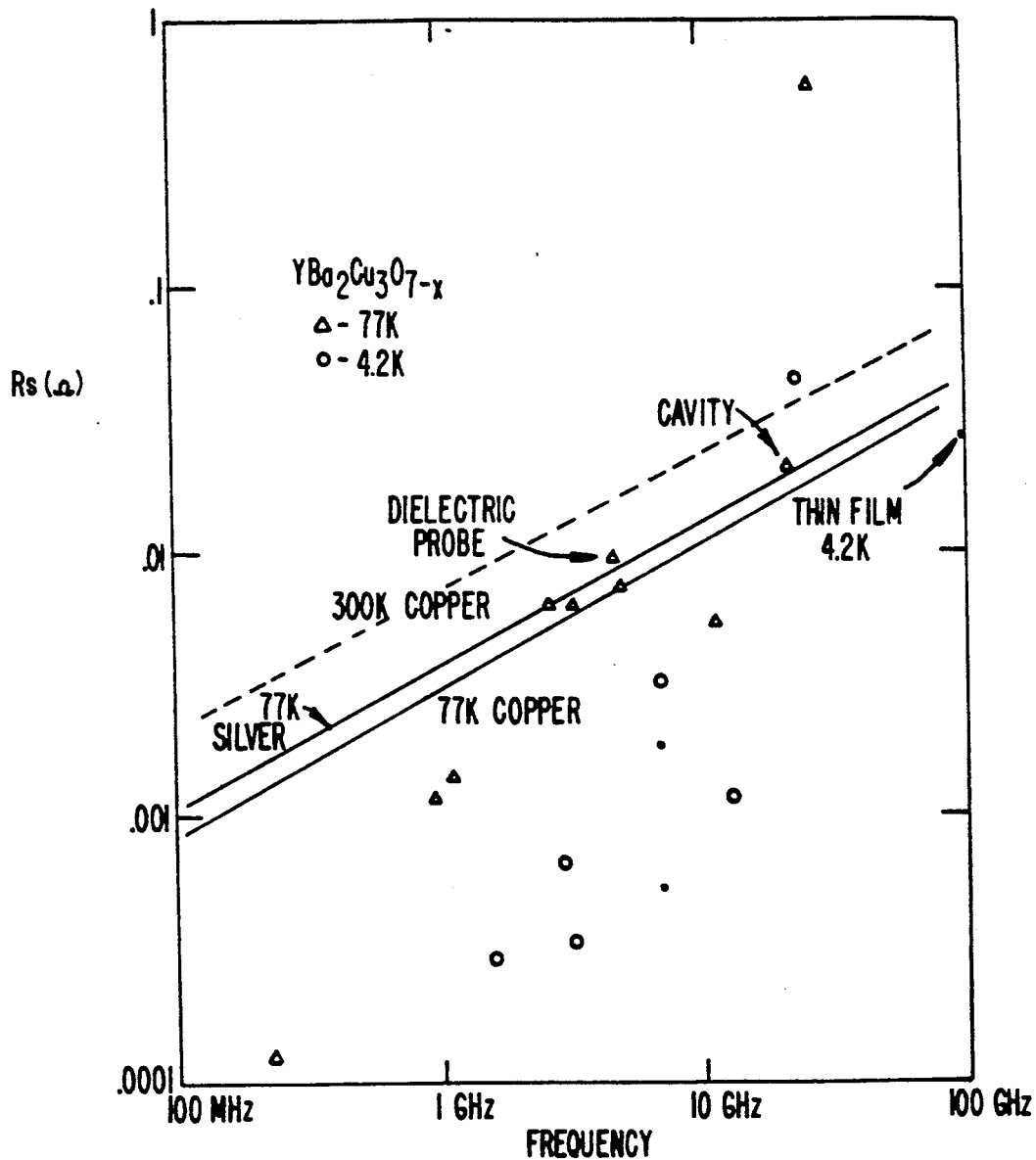
FIG._5.

DIELECTRIC MICROWAVE RESONATOR PROBE

BACKGROUND OF THE INVENTION

The present invention relates to a microwave probe and particularly to a dielectric resonator probe for measuring surface resistance of a test material.

Design and construction of microwave devices requires knowledge of the microwave properties of materials used to construct the device. In the past, a dielectric post resonator has been used to measure room temperature permittivity and permeability of microwave insulators, as described in Marian W. Pospieszalski "On the Theory and Application of Dielectric Post Resonator" *IEEE Transactions on Microwave Theory and Techniques*, Pages 228-231, March, 1977, incorporated herein by reference. A dielectric rod resonator has also been used to obtain the value of the loss tangent of a material as described in Y. Kobayashi, et al, "Microwave Measurement of Dielectric Properties of Low-Loss Materials by the Dielectric Rod Resonator Method", *IEEE Transactions on Microwave Theory and Techniques*, Vol. MTT-33, No. 7, Pages 586-592, July, 1985.

One of the material characteristics of interest is surface resistance. Previous devices for measuring surface resistance have included resonant cavity devices at millimeter wavelengths as described in F. J. Tischer, et al, "Resonant Cavities for the Measurement of the Surface Resistance of Conductors at Millimeter Wavelengths", *Review of Scientific Instruments*, Vol. 46, No. 1, Pages 11-14, January, 1975, incorporated herein by reference.

Previous microwave devices, although usable to provide certain measurements, have been relatively insensitive to small differences in surface resistance. Previous devices have also been difficult to use because of lack of satisfactory mode separation. Furthermore, many previous devices have required a relatively large sample size to make measurements at lower microwave frequencies where measurement accuracy is greatest.

Of particular interest are methods for determining surface resistance of high critical temperature ($T_c$) superconducting materials. The previous uses of the dielectric post resonator have concentrated on room temperature measurements. Previous devices have not been easily adaptable to operation in cryogenic temperatures such as about 98° K. or less. Measurement apparatus which has been used at low temperatures includes a discresonator apparatus. Such a disc resonator requires special processing of the sample to be tested, such as patterning of the disc. In most cases, the sample preparation destroys the usefulness of the sample for subsequent applications.

SUMMARY OF THE INVENTION

According to the present invention, a modified dielectric post resonator probe is used for obtaining surface resistance of a test material. In the modified probe, the dielectric resonator is positioned between a conductive plate and the test material. The dielectric resonator is spaced from the conductive plate, preferably by a dielectric spacer and is substantially in contact with the test material. In the preferred embodiment, the resonator has a hole extending therethrough which assists in providing higher mode separation. The resonator preferably has a stepped shape to maximize measurement sensitivity by substantially confining losses to the sample being tested. The resonator is mounted using a spring-loaded mounting apparatus to accommodate differential thermal expansion for operation at cryogenic temperatures. Preferably, a conductive shield substantially surrounds the sidewall of the resonator and coupling cables used to electromagnetically excite the resonator extend through the sidewall or through the conductive plate.

BRIEF DESCRIPTION OF THE DRAWINGS

FIG. 1 is an explode perspective view, partially cut away, of the apparatus of the present invention and a test material;

FIG. 2 is a cross-sectional view of the apparatus of the present invention taken along line 2—2 of FIG. 1;

FIG. 3 is a cross-sectional view similar to the view of FIG. 2, but showing a second embodiment of the present invention;

FIG. 4 is a schematic view of the peeled lines of $TE_{011}$; and

FIG. 5 depicts microwave surface resistance of high $T_c$ superconductors obtained according to the present invention.

DETAILED DESCRIPTION OF THE PREFERRED EMBODIMENT

As shown on FIG. 1, the resonator probe apparatus 10 of the present invention includes an upper plate 12, a dielectric resonator 14, and coupling cables 16a, 16b. The upper plate 12 is made of a conductive material such as copper. The upper plate 12 has a central hole 18 for use in mounting as described below. The upper plate 12 is preferably integrally formed with a cylindrical sidewall 20.

When the probe is assembled as depicted in FIG. 2, the sidewall 20 substantially surrounds the resonator 14. The sidewall 20 is also formed of a conductive material such as copper. In the embodiment depicted in FIG. 1, holes 22a, 22b are formed in the sidewall to permit insertion of the cables 16a, 16b through the sidewalls 20 in order to position the ends 24a, 24b of the cables adjacent the dielectric resonator 14 as depicted in FIG. 2. In the embodiment depicted in FIG. 2, the cables 16a, 16b are configured for magnetic transmission excitation of the resonator 14. Magnetic loops are formed on the ends of the cables 24a, 24b and a microwave signal such as a signal having a frequency of about 7 Gigahertz (GHz) is transmitted through the cables 16a, 16b to cause magnetic excitation of the resonator 14. The apparatus depicted in FIG. 2 is also capable of reflection excitation in which case a signal is provided on only one of the two cables. If reflection excitation is desired, an apparatus can be provided with only a single cable.

The apparatus depicted in FIG. 3 is similar to the apparatus of FIG. 2, except that the cables 16a, 16b are configured for electrical transmission excitation. In a configuration depicted in FIG. 3 the cable 16a, 16b pass ends of the cables 28a, 28b form wave guides for conveying microwave signals for exciting the resonator 14. As with magnetic excitation, the apparatus of FIG. 3 could be used to provide reflection excitation as well as transmission excitation by providing a signal only over one of the two cables 16a, 16b or by providing only a single cable.

The resonator 14 is made of a dielectric material, preferably having a high permittivity, such as a permittivity of at least about 10, preferably at least about 25. In the preferred embodiment, the dielectric resonator 14 is formed of barium magnesium tantalum oxide (BMT) ceramics. Other materials which can be used to form a dielectric resonator include alumina, Zr/Sn titanate, and barium tetratitanate.

The resonator 14 is formed with an upper surface 32 and a lower surface 34. Preferably, the surface area of the upper surface 32 is less than the surface area of the lower surface 34. The actual surface areas of the upper and lower surface depend upon the material used for the resonator and the frequencies at which testing is to be done since the frequency of a resonator is a function of the permitivity of the material used and the size of the resonator. The surface area of the lower surface 34, which will contact the test material, is less than or equal to the surface area of the test material since the lower surface of the resonator 34 should entirely contact the test material. In the embodiment depicted in FIG. 1, the resonator 14 has a shape which defines segments of two coaxial cylinders, the lower cylinder 36 having a diameter 38 greater than the diameter 56 of the upper cylinder 44. Providing a resonator with a larger surface area in the lower surface 34 than the upper surface 32 increases sensitivity of the apparatus. When measuring resistance, sensitivity is believed related to the areas where loss occurs. In the present apparatus, the amount of loss is related to the surface area of the resonator where it is near the conductive plate 12 and sample 46 respectively. By making the lower surface of the resonator 34, which contacts the sample 46, larger than the upper surface 32 which is positioned near the upper plate 12, a larger portion of the losses occur at the lower surface of the resonator 34, i.e., adjacent the test sample 46. It is believed that in the described apparatus, 80% to 90% of the field is concentrated near the sample 46. By providing most of the loss near the sample, higher sensitivity is obtained.

The resonator 14 preferably includes a hole 48 extending therethrough and forming an opening 52 in the upper surface 32 of the resonator 14. The hole 48 is preferably stepped or countersunk 36 so as to have a larger diameter 54 in the lower portion and a smaller diameter 42 in the upper portion 44. The stepped shape of the hole serves to accommodate a mounting bolt 58 as described more fully below.

The hole 48 increases the mode separation of the device. As described more fully below, an ideal device would operate entirely in a single mode, namely the $TE_{011}$ mode. The field configuration of a $TE_{011}$ is depicted schematically in FIG. 4, in which solid arrows depict the electric field lines 62 and dotted arrows depict the magnetic field lines 64. In practice, however, several other resonances are present. During measurement, the apparatus is operated to sweep across a plurality of frequencies. Occurrence of the desired $TE_{011}$ frequency is identified by the resonant peak or maximum in the spectrum of the transmitted power or the null in the spectrum of the reflected power. When undesired resonances occur at frequencies which are close to the $TE_{011}$ resonance frequencies, the undesired modes can interfere with the desired mode. The hole 48 tends to increase the frequency separation between the desired mode $TE_{011}$ and undesired modes. Thus, providing the hole 48 makes it easier to use the apparatus so as to identify the desired $TE_{011}$ resonance frequency.

To further increase sensitivity of the instrument, the resonator 14 is mounted so as to be spaced from the upper plate 12. In the embodiment depicted in FIG. 1, spacing is achieved by providing a dielectric spacer 66 positioned between the resonator 14 and the upper plate 12. The dielectric spacer 66 preferably is in the form of a cylinder and has a hole 68 extending therethrough for accommodating the bolt 58. The dielectric spacer 66 preferably has a low dielectric constant of less than about 5. The dielectric spacer can be formed of a number of materials including fluorinated ethylene-propylene resins and tetrafluoroethylene fluorocarbon polymers such as those sold under the trade name TEFLON TM, available from E.I. DuPont de Nemours & Co., Wilmington, Del., and crosslinked polystyrene, such as that sold under the trade name REXOLITE TM, available from American Enka Corp. The dielectric spacer 20 preferably is formed of a low-loss material and preferably has a loss tangent less than about $10^{-4}$ at room temperature. By forming the device so that the resonator 14 contacts the test sample 46 but is spaced from the conductive upper plate 12, most of the loss which occurs in the device occurs in the region of the specimen 46. Thus, by spacing the resonator 14 from the top plate 12, the losses are concentrated in the sample 46 and the sensitivity of the apparatus is thereby increased.

The apparatus described is particularly useful for measuring surface resistance of the test sample 46 under cryogenic conditions, such as temperatures less than about 90° K. The described device includes a number of components which are made of materials having thermal expansion coefficients which are quite different from one another. According to the present invention, certain components of the device are mounted in a resilient fashion so as to accommodate the differential thermal expansion and absorb the stresses which would otherwise be caused by such differential thermal expansion. In the embodiment depicted in FIG. 1, the resilient mounting apparatus includes a bolt 58 passing through various holes 48, 68, 18, a helical spring 72 and a nut 74. As best seen in FIG. 2, the bolt 58 extends through the holes 48, 68, 18 in the resonator 14, dielectric spacer 66 and upper plate 12. The end of the bolt 58 extends above the upper surface of the plate 12 and through the helical spring 72 to engage the nut 74. Tightening the nut 74 causes the spring 72 to be compressed between the nut 74 and the plate 12. Such compression causes the bolt 58 to exert a force on the resonator 14 urging it in a direction towards the plate 12 and thus maintaining the resonator 14 and dielectric spacer 66 in the configuration depicted in FIG. 2. As the device is cooled to cryogenic temperatures, the plate 12, resonator 14, and dielectric spacer 66 will undergo differential thermal expansion. The stresses caused by the differential thermal expansion, however, will be absorbed by the helical spring 72 and the apparatus can thus be cooled to cryogenic temperatures without stresses from differential thermal expansion accumulating to the point of inducing failure in one of the components. In order that the presence of the bolt 58 should not interfere with the mode separation achieved by the hole 48, the bolt 58 is preferably formed of a non-conducting material such as a thermoplastic resin or REXOLITE TM.

The test sample 46 is preferably mounted in a recess 76 which is formed in a mounting plate 78. In one preferred embodiment, the mounting plate 78 is formed of a material of known conductivity such as copper so that the apparatus 10 can be easily calibrated by positioning the resonator 14 over the plate 78. By forming the resonator 14 with a substantially flat lower surface 34, the resonator 14 can be positioned adjacent the test material 46 as depicted in FIG. 2.

In operation, the apparatus depicted in FIG. 2 is assembled and cooled to a cryogenic temperature. In one embodiment, the apparatus is positioned in a Dewar jar having a cooling stage cooled by liquid nitrogen. To determine microwave surface resistance of the test material 46, the quality factor (Q factor) of the structure must be measured. The Q factor is obtained from the relationship:

$$1/Q_{total} = 1/Q_d + 1/Q_{top1} + 1/Q_{top2} + 1/Q_{bottom1} + 1/Q_{bottom2} + 1/Q_r$$

where:

$Q_d = 1/\tan\delta$ — the dielectric quality factor;

$Q_r$ = the radiation quality factor, which in this case can be omitted since the fields are largely confined in the high permitivity dielectric resonator;

$$\frac{Q_{top1}}{Q_{bottom1}} = \text{the quality factor corresponding to losses in conductive plates directly under the high dielectric, top/bottom respectively;}$$

$$\frac{Q_{top2}}{Q_{bottom2}} = \text{the quality factor corresponding to losses in conductive plates outside the dielectric top/bottom respectively.}$$

Using the measured Q factor, surface resistance is obtained according to the following relationship:

$$R_{smeas} = (A/Q_{total} - \tan\delta)/B - R_{sfixt}$$

where;

$$A = 1 + W/\epsilon$$

$$B = (\lambda_o/2L)^3 * (1 + W)/(60\pi^2\epsilon)$$

$$W = \frac{J1^2(\xi)[K0(\zeta) - K1^2(\zeta)]}{K1^2(\zeta)[J1^2(\xi) - J0(\xi)J2(\xi)]}$$

Rsmeas = surface resistance of the sample;
$R_{sfixt}$ = surface resistance of the fixture;
L = length of the dielectric resonator;
$\epsilon$ = dielectric constant;
$\lambda_o$ = wavelength;
$\xi^2 = (2\pi/\lambda_o)^2 - (\pi/L)^2$
$\zeta^2 = (\pi/L)^2 - (2\pi/\lambda_o)^2$
J0, J1, J2, K0, K1, K2 are regular and modified Bessel functions Further information describing these relationships is found in Kobayoshi, supra.

EXPERIMENTAL

A dielectric resonator probe was used to determine microwave surface resistance of bulk high $T_c$ superconductors such as YBaCuO and BiSrCaCuO. The results are depicted in FIG. 5.

In view of the above description, a number of advantages to the present invention are apparent. The device is operable at cryogenic temperatures and provides increased sensitivity. The device also provides for superior mode separation. Radiation losses are minimized by providing the side shield. The apparatus can be used for non-destructive testing and no special processing or patterning of the sample is needed. Due at least partly to the high dielectric constant of the dielectric resonator materials which can be used in this invention, the surface area of the samples needed for measurement is quite small. For example, a sample with a surface area less than 0.2 cm$^2$ can be measured at a frequency of 10 GHz while still obtaining desired accuracy of measurement.

Variations and modifications of the described invention can also be used. The apparatus can be provided without mounting the sample 46 in a plate 78. The resonator 14 can be resiliently mounted using other than the screw and spring mechanism depicted. The apparatus can be operated in non-cryogenic environments. In addition to using the apparatus for obtaining a bulk surface resistance value, the apparatus can be used to probe larger samples of materials, e.g. to locate areas with the best microwave properties.

Although the present invention has been described by way of a preferred embodiment in various modifications, other modifications and variations will also be apparent to those skilled in the art, the invention being defined by the appended claims.

What is claimed is:

1. A dielectric resonator probe apparatus for measuring surface resistance of a test material comprising:
   a first electrically conductive plate;
   a spacer comprised of a solid dielectric material;
   a dielectric resonator having an upper surface, a lower surface and a sidewall, mounted in a substantially fixed position with respect to said plate with said upper surface spaced from said plate by said spacer to maintain said resonator in said substantially fixed position; and
   means for electromagnetically exciting said resonator.

2. Apparatus as claimed in claim 1, further comprising:
   means for positioning said resonator adjacent the test material.

3. Apparatus, as claimed in claim 1, wherein said dielectric material has a dielectric constant of at least about less than about 5.

4. Apparatus, as claimed in claim 1, wherein said dielectric material includes material selected from the group consisting of tetrafluoroethylene fluorocarbon polymers, fluorinated ethylene-propylene resins and crosslinked polystyrene.

5. Apparatus, as claimed in claim 1, wherein said resonator has a permittivity of at least about 10.

6. Apparatus, as claimed in claim 1, wherein said means for electromagnetically exciting said resonator comprises at least a first cable having an end positioned adjacent said resonator.

7. Apparatus, as claimed in claim 1, further comprising an electrically conductive shield substantially surrounding said resonator sidewall.

8. Apparatus, as claimed in claim 7, wherein said means for electromagnetically exciting said resonator comprises at least a first cable extending through said shield.

9. A dielectric resonator probe apparatus for measuring surface resistance of a test material comprising:
   a first electrically conductive plate;
   a dielectric resonator having an upper surface, a lower surface and a sidewall, mounted in a substantially fixed position with respect to said plate with said upper surface spaced from said plate to maintain said resonator in said substantially fixed position;

means for relieving stress induced by differential thermal expansion; and means for electromagnetically exciting said resonator.

10. Apparatus, as claimed in claim 9, wherein said differential thermal expansion occurs upon cooling said apparatus to a cryogenic temperature.

11. Apparatus, as claimed in claim 9, further comprising a spacer comprised of a solid dielectric material, positioned between said resonator and said plate.

12. A dielectric microwave resonator probe apparatus for measuring surface resistance of a test material comprising:

a first electrically conductive plate;

a dielectric resonator having an upper surface, a lower surface, and a sidewall, mounted in a position with respect to said plate with said upper surface spaced from said plate;

means for electromagnetically exciting said resonator; and means for relieving stress induced by differential thermal expansion wherein said means for relieving stress includes means for resiliently mounting said resonator with respect to said plate.

13. A dielectric resonator probe apparatus for measuring surface resistance of a test material comprising:

a first electrically conductive plate;

a dielectric resonator having an upper surface, a lower surface and a sidewall, mounted in a substantially fixed position with respect to said plate to maintain said resonator in said substantially fixed position;

means for electromagnetically exciting said resonator;

means for positioning said resonator in contact with the test material; and an electrically conductive shield substantially surrounding said resonator sidewall.

14. Apparatus, as claimed in claim 13, wherein said means for electromagnetically exciting said resonator comprises at least a first cable extending through said shield.

15. Apparatus, as claimed in claim 13, wherein said resonator has a permittivity of at least about 10.

16. Apparatus, as claimed in claim 13, wherein said means for electromagnetically exciting said resonator comprises at least a first cable having an end positioned adjacent said resonator.

17. A dielectric resonator probe apparatus for measuring surface resistance of a test material comprising:

a first electrically conductive plate; and a dielectric resonator having an upper surface, a lower surface and a sidewall, mounted in a substantially fixed position with respect to said plate, to maintain said resonator in said substantially fixed position said upper surface having a first area, said lower surface having a second area greater than said first area.

18. Apparatus, as claimed in claim 17, wherein said sidewall defines at least a first cylindrical section adjacent said upper surface, having a first diameter and a second cylindrical section adjacent said lower surface, having a second diameter greater than said first diameter.

19. A dielectric resonator probe apparatus for measuring surface resistance of a test material comprising:

a first electrically conductive plate;

a dielectric resonator having an upper surface, a lower surface and a sidewall, and having a resonator hole extending from said lower surface to said upper surface;

a spacer, having a spacer hole substantially aligned with said resonator hole, said spacer positioned between said upper surface of said resonator and said plate;

means for mounting said dielectric resonator in a substantially fixed position with respect to said plate to maintain said resonator in said substantially fixed position.

20. Apparatus as claimed in claim 19, wherein said means for mounting includes a substantially non-conducting mounting device which extends through said resonator hole.

21. A dielectric resonator probe apparatus for measuring surface resistance of a test material comprising:

a first electrically conductive top plate;

a dielectric resonator having an upper surface, a lower surface and a sidewall; and means for resiliently attaching said dielectric resonator to said top plate in a substantially fixed position spaced a first distance from said plate to maintain said resonator at said first distance from said plate.

22. A dielectric resonator probe apparatus for measuring surface resistance of a test material:

a first electrically conductive plate;

a dielectric resonator having an upper surface, a lower surface and a sidewall;

means for resiliently mounting said dielectric resonator in a position spaced from said plate wherein said means for resiliently mounting includes:

a non-conducting bolt extending through said resonator and said plate and engaging a nut; and a spring urging said nut in a direction away from said plate.

23. A dielectric resonator probe apparatus for measuring surface resistance of a test material comprising:

a first electrically conductive plate;

a dielectric spacer positioned adjacent said plate;

a dielectric resonator resiliently mounted with respect to said plate and spaced from said plate by said dielectric spacer, said resonator having an upper surface, a lower surface, and a sidewall, said sidewall defining at least a first cylindrical section adjacent said upper surface having a first diameter and a second cylindrical section adjacent said lower surface having a second diameter greater than said first diameter, said dielectric resonator having a hole extending from said lower surface to said upper surface;

an electrically conductive shield substantially surrounding said resonator sidewall and integrally formed with said first electrically conductive plate;

at least a first cable extending through one of said plate and said shield and having an end position adjacent to said resonator; and means for mounting said resonator in a substantially fixed position with respect to said plate, to maintain said resonator in said substantially fixed position said means including a non-conductive mounting device extending through said hole.

24. A method for measuring surface resistance of a test material, comprising:

providing a dielectric resonator probe which includes:

a first electrically conductive plate;

a dielectric resonator having an upper surface, a lower surface and a sidewall;

means for mounting said dielectric resonator in a position spaced from said plate;

means for electromagnetically exciting said resonator;

cooling said probe and said test material to a temperature below about 90° K.;

positioning said test material adjacent said lower surface;

exciting said resonator using said means for electromagnetically exciting;

measuring the Q factor of said test material; and determining surface resistance of said test material, using the Q value measured in said step of measuring.

25. A method, as claimed in claim 24, further comprising:
calibrating said probe by positioning said lower surface adjacent a second conductive plate.

26. A method, as claimed in claim 24, wherein said step of providing a dielectric resonator probe includes providing a probe which has a dielectric material position between said resonator and said plate.

27. A method, as claimed in claim 24, wherein said step of providing a dielectric resonator probe includes providing a dielectric resonator having said upper surface with a first area less than the area of said lower surface.

28. A method, as claimed in claim 24, wherein said step of providing a dielectric resonator probe includes providing a means for mounting said dielectric resonator and for simultaneously relieving stress induced by differential thermal expansion.

* * * * *